(12) United States Patent
Huang et al.

(10) Patent No.: US 9,034,677 B2
(45) Date of Patent: *May 19, 2015

(54) MEMS DEVICE AND METHOD OF FORMATION THEREOF

(71) Applicant: Taiwan Semiconductor Manufacturing Company, Ltd., Hsin-Chu (TW)

(72) Inventors: Hsin-Ting Huang, Bade (TW); Jung-Huei Peng, Jhubei (TW); Shang-Ying Tsai, Pingzhen (TW); Yao-Te Huang, Hsinchu (TW); Ming-Tung Wu, Hsinchu (TW); Ping-Yin Liu, Yonghe (TW); Xin-Hua Huang, Xihu Township (TW); Yuan-Chih Hsieh, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/057,909

(22) Filed: Oct. 18, 2013

(65) Prior Publication Data

US 2014/0248730 A1 Sep. 4, 2014

Related U.S. Application Data

(63) Continuation of application No. 13/206,014, filed on Aug. 9, 2011, now Pat. No. 8,580,594.

(51) Int. Cl.
*H01L 21/02* (2006.01)
*B81C 1/00* (2006.01)
*H01L 23/00* (2006.01)

(52) U.S. Cl.
CPC ... *B81C 1/00777* (2013.01); *H01L 2224/48463* (2013.01); *B81C 1/00896* (2013.01); *B81B 2207/07* (2013.01); *H01L 2924/13091* (2013.01); *H01L 2924/01322* (2013.01); *H01L 2924/10253* (2013.01); *H01L 24/03* (2013.01); *H01L 24/05* (2013.01); *H01L 24/48* (2013.01); *H01L 2224/03001* (2013.01); *H01L 2224/05571* (2013.01); *H01L 2224/48091* (2013.01); *H01L 2224/85375* (2013.01); *H01L 2924/00014* (2013.01); *H01L 2924/1461* (2013.01)

(58) Field of Classification Search
USPC .......... 257/704, 728, 782, E23.004, E23.193; 438/48
See application file for complete search history.

(56) References Cited

U.S. PATENT DOCUMENTS

| 6,525,413 | B1 | 2/2003 | Cloud et al. | |
| 6,876,071 | B2 | 4/2005 | Liu et al. | |
| 8,580,594 | B2 * | 11/2013 | Huang et al. | 438/48 |

FOREIGN PATENT DOCUMENTS

WO WO2009070348 A1 6/2009

* cited by examiner

*Primary Examiner* — Thomas L Dickey
(74) *Attorney, Agent, or Firm* — Haynes and Boone, LLP

(57) ABSTRACT

The present disclosure provides a method including providing a first substrate; and forming a microelectromechanical system (MEMS) device on a first surface of the first substrate. A bond pad is formed on at least one bonding site on the first surface of the first substrate. The bonding site is recessed from the first surface. Thus, a top surface of the bond pad may lie below the plane of the top surface of the substrate. A device with recessed connective element(s) (e.g., bond pad) is also described. In further embodiments, a protective layer is formed on the recessed connective element during dicing of a substrate.

20 Claims, 12 Drawing Sheets

MEMS DEVICE AND METHOD OF FORMATION THEREOF

CROSS-REFERENCE

This application is a continuation of U.S. Ser. No. 13/206,014 filed Aug. 9, 2011, and entitled, "MEMS Device and Method of Formation Thereof," the entire disclosures of which is incorporated herein by reference.

BACKGROUND

Microelectromechanical systems (MEMS) devices are very small electro-mechanical systems often incorporated into integrated circuit devices. The products including MEMS devices often include a capping structure secured to a substrate including the MEMS device. The capping structure serves to enclose, secure, protect, and/or maintain a proper environment for the MEMS device to operate. The fabrication and development of products including MEMS devices has experienced numerous challenges. One such challenge in traditional assembly processes is maintaining the quality, reliability, and/or yield of the product during the bonding and formation of the capping structure. For example, singulating the capping structure may result in damage to unprotected features. Debris from the singulation can land on the substrate including the MEMS device causing defects. Therefore, what is needed is a manner of protecting features while preparing devices including MEMS.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. For example, though one or more methods or devices described herein discuss the bonding of a device substrate (e.g., including a MEMS device) and a capping substrate, in embodiments, the present disclosure may be applied to any type of substrate coupled with another substrate including substrates having MEMS devices formed thereon or disposed there (e.g., bonded thereto), substrates including integrated circuit (IC) devices (e.g., fabricated using CMOS or other suitable processes), substrates including both IC and MEMS devices, various capping substrates, and/or other suitable substrates. Further, though the present disclosure refers to microelectromechanical systems (MEMS) devices, one of ordinary skill in the art will find other applicable technologies that may benefit from the disclosure including, but not limited to, nanoelectromechanical systems (NEMS) devices.

Additionally, the formation of a first feature "over", "on", "connected" or "coupled to" a second feature, and like descriptive terms, in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
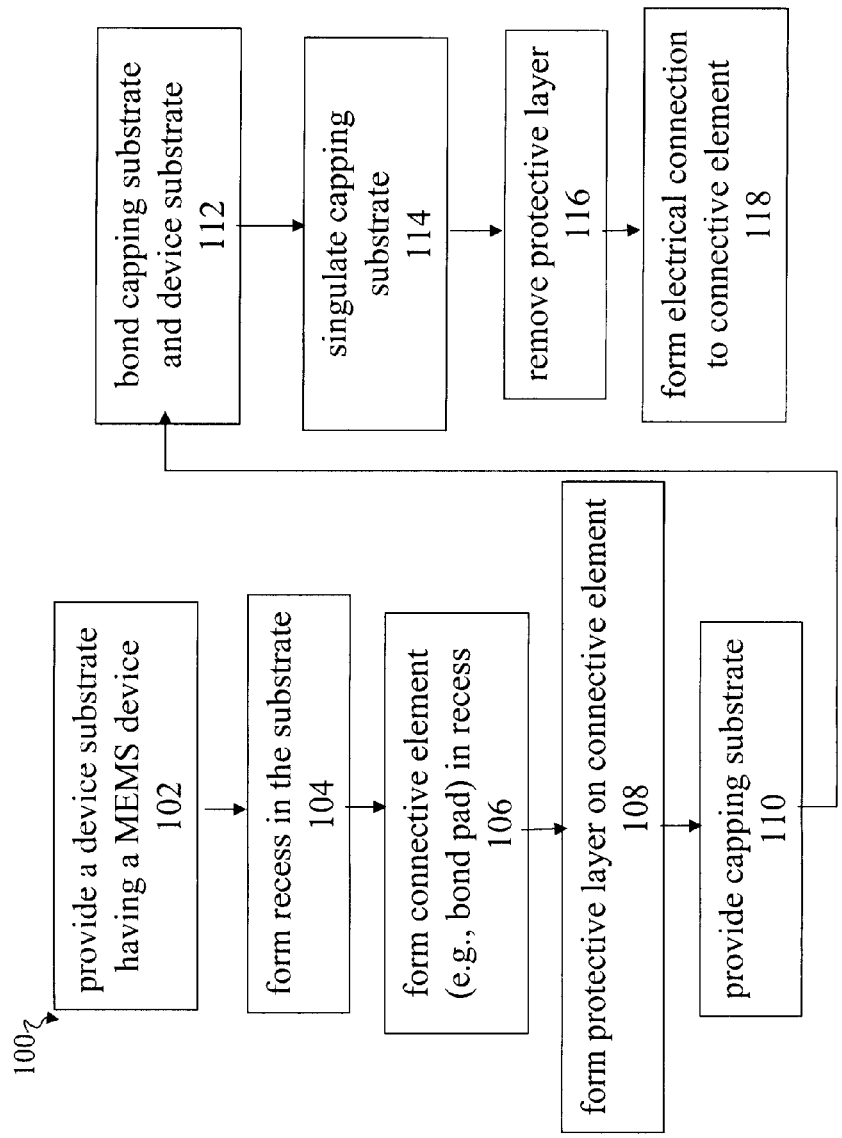
FIG. 1 is a flow chart illustrating an embodiment of a method including one or more aspects of the present disclosure.

Illustrated in FIG. 1 is a flow chart of a method 100 for fabricating a device including a MEMS device. FIGS. 2-11 are cross-sectional views of a device 200 fabricated according to the method 100 of FIG. 1. It is understood that additional steps can be provided before, during, and/or after the method 100, and some of the steps described below can be replaced or eliminated for additional embodiments of the method. It should be further understood that additional features can be added to the device 200, and/or features omitted from the device 200, for additional embodiments of the device 200. The device 200, shown in various stages, is exemplary only and used for ease of understanding.

The method 100 begins at block 102 where a substrate is provided. The substrate includes at least one MEMS device disposed thereon. In some embodiments, the substrate may further include an integrated circuit (IC) device or portion thereof. The MEMS device may be fabricated on the substrate or fabricated and subsequently coupled (e.g., bonded) to the substrate. The substrate provided, which includes a MEMS device, may be referred to herein as a device substrate. Exemplary MEMS devices include elements forming a motion sensor (for example, a gyroscope or an accelerometer, an RF MEMS device (for example, an RF switch or filter), an oscillator, a MEMS microphone, and/or any other MEMS type device, including later developed MEMS devices.

As described above, in an embodiment, the device substrate also includes various layers and features that can combine to form various microelectronic elements that may include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The microelectronic elements could be interconnected to one another to form a portion of an integrated circuit device, such as a logic device, memory device (for example, a static random access memory (SRAM)), radio frequency (RF) device, input/output (I/O) device, system-on-chip (SoC) device, other suitable types of devices, or combinations thereof. In an embodiment, the device substrate includes an integrated circuit device (or portion thereof) designed and formed by CMOS based processes. A substrate including a device formed using other integrated circuit fabrication technologies is also within the scope of the present disclosure.

The device substrate provided may be in wafer form. In one example, the substrate is a silicon wafer. The device substrate may alternatively or additionally include other elementary semiconductor, such as germanium. The substrate may also include a compound semiconductor, such as silicon carbide, gallium arsenic, indium arsenide, and indium phosphide. The device substrate may include any plurality of layers formed thereon such as insulating layers, dielectric layers, conductive layers, and/or other suitable materials.

Figure 2:
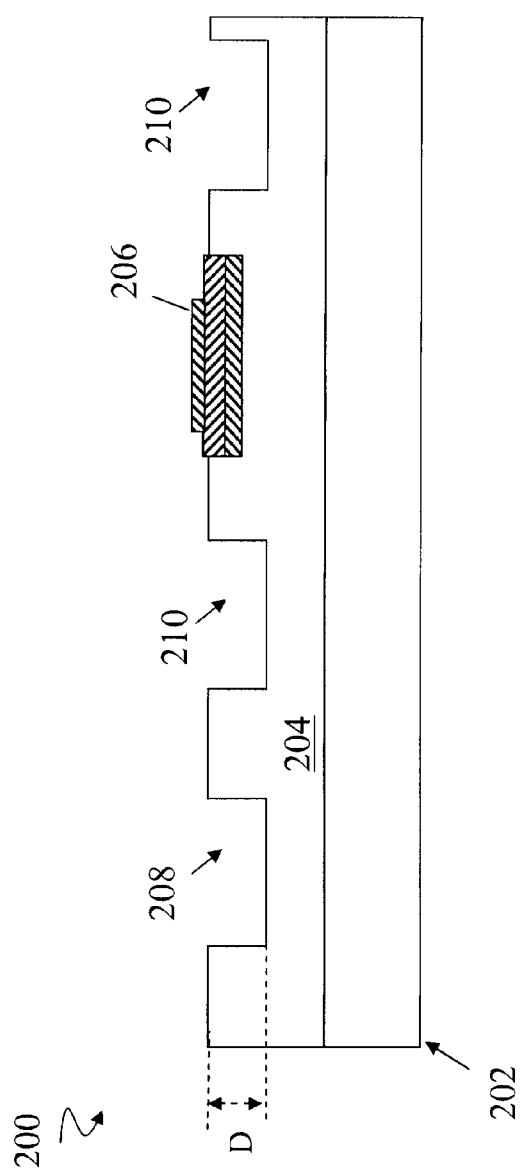
FIGS. 2, 3, 4, 5, 6, 7, 8, 9, 11 and 12 are cross sectional views of an embodiment of a device fabricated according to one or more steps of the method of FIG. 1.

Referring to the example of FIG. 2, a device 200 including a device substrate 202 is provided. The device substrate 202 includes a device layer 204. The device layer 204 may include the portion of the device substrate 202 including MEMS and/or IC devices or features of MEMS and/or IC devices. In an embodiment, the device substrate 202 is a wafer and a portion of the wafer is illustrated in FIG. 2. The device substrate 202 includes a MEMS device 206. The MEMS device 206 may be one or more elements which together form portions of a motion sensor (for example, a gyroscope or an accelerometer, an RF MEMS device (for example, an RF switch or filter), an oscillator, a microphone, bio MEMS, or other MEMS device. In other words, the term "MEMS device" as applied in the present disclosure, is not restricted to a product-level MEMS device but can include any number of MEMS elements used to form such a product.

The method 100 then proceeds to block 104 where a recess is formed in the device substrate. The recess may be formed on the same surface of the substrate that the MEMS device is disposed. In an embodiment, a plurality of recesses is formed in the device substrate. The recesses may be formed by suitable photolithography and etching processes including wet etch and/or dry etching. The position of the recesses on the substrate may be determined by the layout design for the device. The layout design may define one or more bonding sites for a device (e.g., regions of a substrate designed to include elements that provide for physical and/or electrical bonding to another substrate, device, etc.) In an embodiment, a recess is formed at a portion of the layout where a bond pad providing an electrical connection to a circuit formed on the device substrate is desired.

Referring again to the example of FIG. 2, a plurality of recesses, including recess 208 and recesses 210, are formed on the substrate 202. In particular, the recesses 208 and 210 are formed in the device layer 204 of the device substrate 202. In an embodiment, the recesses 208 and 210 are approximately 1.5 µm in depth D. In other embodiments, the recesses 208 and 210 may be between approximately 1 µm and 3 µm in depth D. The recesses 210 may define a region of a bond ring formed between the device substrate 202 and an adjoining substrate as described below. The recess 208 may define a bonding region for a bond pad that provides for an electrical connection to elements on the substrate 202 (e.g., an I/O bond pad of the substrate 202).

The method 100 then proceeds to block 106 where a connective element is formed in a recess. In an embodiment, pads or other connective elements are formed in each of a plurality of recesses. The connective element may be a bond pad. The bond pad may include aluminum, copper, gold, and/or other suitable conductive materials. The bond pad may be an I/O bond pad providing connection to one or more elements or features disposed on the substrate (e.g., elements of an IC). The bond pad may be connected to an interconnect such as a multi-level interconnect including conductive lines and vias of an IC. Other connective elements include connective features providing mechanical and/or electrical connection between the substrate 202 and other substrates.

Figure 3:
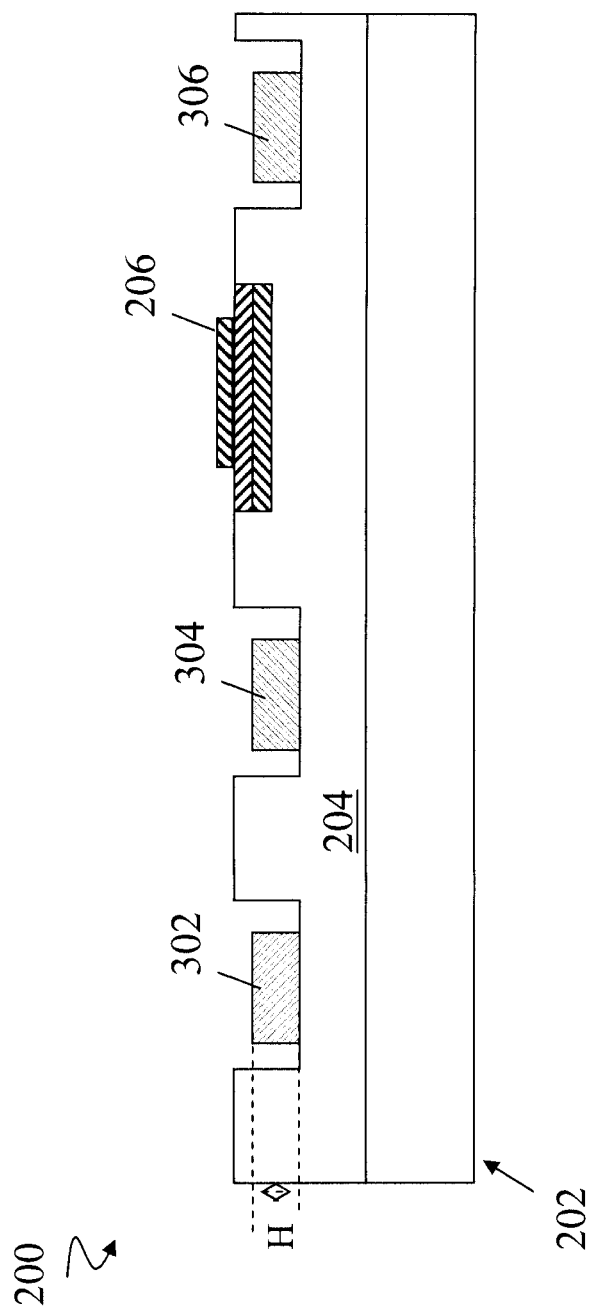

Referring to the example of FIG. 3, illustrated is a plurality of connective elements 302, 304, and 306. Though three connective elements are illustrated, any number is possible. The connective element 302 is a bond pad, e.g., an I/O bond pad. In an embodiment, bond pad 302 provides a bond pad for connection to a circuit component of the device substrate 202, such a provided by wire bonding or bumping. In an embodiment, connective elements 304 and 306 provide a connection (e.g., mechanical connection or coupling) to another substrate, such as, for example, a capping substrate as described below with reference to FIGS. 5-8. In an embodiment, connective elements 304 and 306 provide no electrical connection between components, for example, providing only a physical connection to the substrate 202. Thus, in an embodiment, the connective elements 304 and/or 306 may be disposed on an insulating layer of the device layer 204. In an embodiment, the bond pad 302 is between approximately 8000 Angstroms and approximately 10,000 Angstroms in thickness H. In an embodiment, the connective elements 306 and 306 are between approximately 8000 Angstroms and approximately 10,000 Angstroms in thickness.

The connective elements 302, 304, and/or 306 may be substantially similar to one another (e.g., include the same composition) or may be formed in different processes and/or use different compositions. The bond pad 302 may include aluminum, copper, gold, and/or other suitable conductive materials. The connective elements 304 and/or 306 may be comprised of a suitable material to provide a mechanical connection to another substrate. Examples of the connective elements 304 and/or 306 include bonding layers having compositions that include amorphous silicon, polysilicon, a combination of amorphous silicon and polysilicon, silicon doped with one or more impurities, aluminum or a substantially aluminum-based bonding layer, Ge (germanium), In (indium), Au (gold), Sn (tin), Cu (copper), other conductive material, alloys thereof (such as AlGe or AuSn), and/or combinations thereof. The connective elements 302, 304, and/or 306 may be formed by plating, physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the connective elements 302, 304, and 306 may include photolithography processing and/or etching to pattern a bonding layer.

Though illustrated as providing each of connective elements 302, 304, and 306 all in recesses formed on the substrate 202, this is exemplary only. In other embodiments, one or more of the connective elements may be provided on or above the top surface of the wafer 202 (e.g., without formation of a recess). In an embodiment, the bond pad 302 is formed in a recess and the connective elements 304 and 306 are disposed on the surface of the substrate 202.

The method 100 then proceeds to block 108 where a protective layer is formed on one or more of the connective elements. The protective layer may include amorphous carbon, diamond-like carbon (DLC), amorphous silicon, an oxide (e.g., silicon oxide, silicon oxynitride, metal oxide), a nitride, and/or other suitable material. In an embodiment, the protective layer is formed on and around an I/O bond pad formed in a recess. Thus, the protective layer may be formed such that a bond pad that is to be subsequently used for wire bonding (or suitable means of electrical connection) is surrounded by the protective layer (e.g., exposed sides of the pad are covered). A layer of protective material may be formed by chemical vapor deposition (CVD), spin on deposition, and/or other suitable deposition technique. Subsequently, the deposited layer of protective material may be patterned using photolithography and/or etching techniques known in the art.

Figure 4:
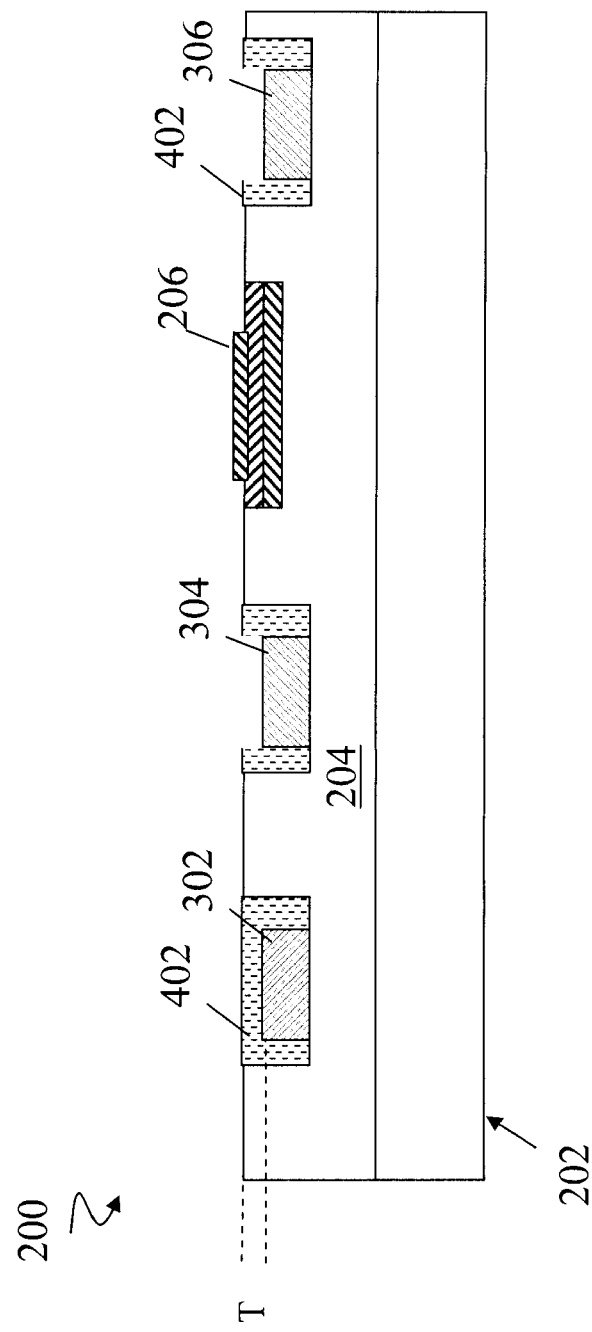

Referring to the example of FIG. 4, a protective layer 402 is formed on the substrate 202 and the connective elements 302, 304, and 306. The protective layer 402 may be between approximately 3000 Angstroms and approximately 5000 Angstroms in thickness T, by way of example.

Though illustrated as providing the protective layer 402 in all recesses formed on the substrate 202. In alternative embodiments, the protective layer 402 is not formed on connective elements 304 and/or 306. The embodiment of FIG. 4 also illustrates that the protective layer 402 may be patterned such that it is removed from a top surface of the connective elements 304 and 306. In other words, the protective layer is removed from a bonding surface of the connective elements 304 and 306 (e.g., using suitable photolithography and etching processes).

The method 100 then proceeds to block 110 where a second substrate is provided. In an embodiment, a capping substrate is provided. The capping substrate may include silicon. However, other suitable materials now known or later developed are suitable and within the scope of disclosure. The capping substrate may be provided to form a cavity within which the MEMS device can be disposed and operate. The cavity may provide a vacuum or other controlled environment. The capping substrate may further include connective elements or bonding layer(s) including material suitable for providing a physical and/or electrical connection with the device substrate. Examples include bonding layers having compositions that include amorphous silicon, polysilicon, a combination of amorphous silicon and polysilicon, silicon doped with one or more impurities, aluminum or a substantially aluminum-based bonding layer, Ge (germanium), In (indium), Au (gold), Sn (tin), Cu (copper), other conductive material, alloys thereof (such as AlGe or AuSn), or combinations thereof. In an embodiment, the connective elements of the capping structure are provided on stand-off features that define the cavity. In other embodiments, other types of substrates may be provided for bonding with the device substrate in addition to or in lieu of the capping substrate.

Figure 5:
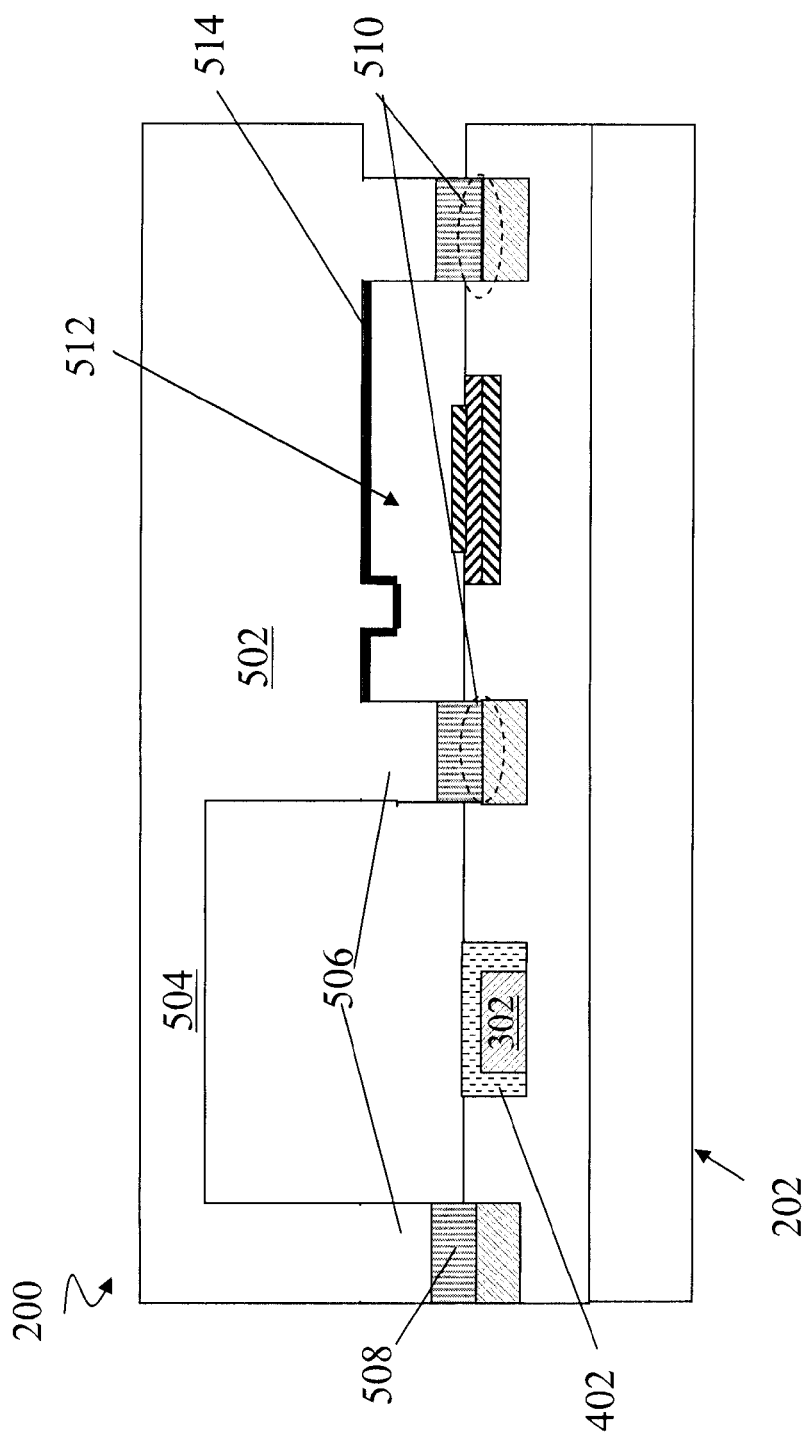

Referring to the example of FIG. 5, a capping substrate 502 is illustrated. Referring to the example of FIG. 7, a capping substrate 702 is provided. The capping substrate 502 and 702 may be substantially similar except that the capping substrate 502 may be designed to be singulated (e.g., diced) using a grind process, while the capping substrate 702 may be singulated using a saw process. For example, the capping substrate 502 includes a thin region 504.

The capping substrate 502 and/or 702 include silicon and/or another suitable material. In the depicted embodiment, the capping substrates 502 and 702 include stand-off features 506. Lithography processing and/or etching may be used to pattern and define the stand-off features 506. A bonding layer 508 is disposed on the stand-off features 506. The stand-off feature 506 may be configured to provide the appropriate separation between the device substrate 202 and capping substrate 502 or 702, respectively. The bonding layer 508 may be any material suitable to provide a mechanical (e.g., electrical and mechanical) connection between the substrate 502 or 702 and the device substrate 202. Exemplary bonding layer 508 compositions include metal, silicon, and/or other suitable materials.

The method 100 then proceeds to block 112 where the capping substrate and the device substrate are bonded. In an embodiment, the bonding provides an electrical interface between the first and second substrate (and devices formed thereon) at one or more bonding regions (e.g., region of physical interface between substrates). In an embodiment, no electrical interface is provided at the region. For example, at a bonding region one or more of the bonding layers is formed on a non-conducting layer (e.g., insulating layer) and no electrical interface is provided at that region.

To bond, the connective element (or bonding layer) of the capping substrate may be interfaced with connective element of the device substrate. In an embodiment, substrates may be bonded using a eutectic (wetting) bonding process, though other techniques are possible. The eutectic reaction is achieved by heating the connective elements or bonding layer(s) to their eutectic temperature, the temperature at which a combination of the connective elements or bonding layers initially forms a liquid or molten state (eutectic state). The materials at the interface of the connective elements or bonding layers then diffuse together to form an alloy composition—or a eutectic alloy layer. Alternatively, the bonding between the substrates may be achieved by thermal compressive bonding, thermal diffusion bonding, and/or other suitable manners. The bonding process may be performed in the presence of a forming gas and/or another controllable environment. Example forming gases include argon, nitrogen ($N_2$), hydrogen ($H_2$), nitrogen/hydrogen mixture, and/or other suitable gases. In an embodiment, a surface clean is performed prior to the bonding process. The surface clean may include a wet etch (e.g., HF), a dry etch (e.g., argon sputtering and plasma etch processes), or combinations thereof. The bonding may be performed by a commercially available wafer bonder, and an alignment process is typically performed prior to the bonding process.

Referring to the example of FIG. 5, the capping substrate 502 is physically connected (e.g., bonded) to the device substrate 202 at a bonding region 510. The bonding region 510 includes bonding of connective element 304 and bonding layer 508. In an embodiment, the bonding region 510 provides a ring (e.g., seal ring) defining a cavity 512 formed between the capping substrate 502 and the device substrate 202. The seal ring bonding region may ensure a vacuum or otherwise controllable environment in the cavity 512. One or more MEMS devices 206 are disposed in the cavity 512. The region of the capping substrate 502 providing a boundary for the cavity 512 may be coated with a material 514 having anti-stiction properties, as known in the art. The anti-stiction layer 514 may be an organic based material, include self-assembled monolayers (SAMs), and/or formed by molecular vapor deposition (MVD) or other suitable process.

Figure 7:
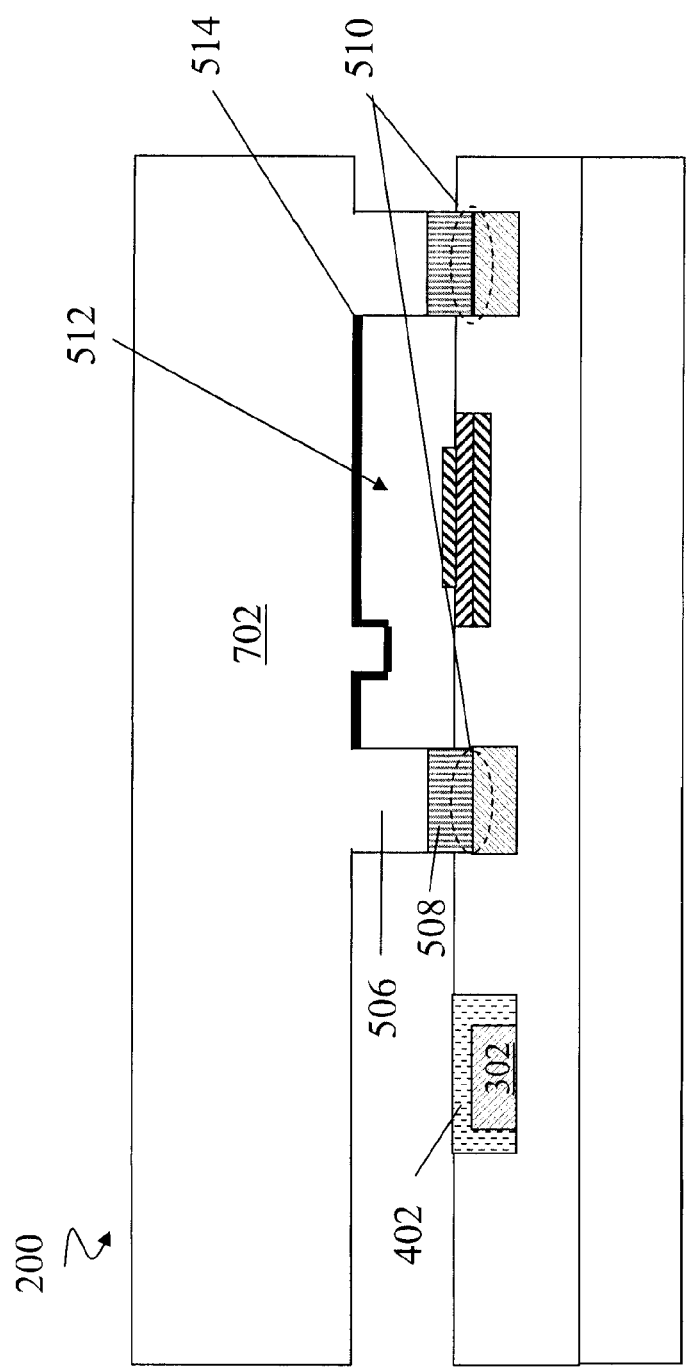

Referring to the example of FIG. 7, the capping substrate 702 is physically connected (e.g., bonded) to the device substrate 202 at a bonding region 510. The bonding region 510 includes bonding of connective element 304 and bonding layer 508. In an embodiment, the bonding region 510 provides a ring (e.g., seal ring) defining a cavity 512 formed between the capping substrate 702 and the device substrate 202. The seal ring bonding region may ensure a vacuum or otherwise controllable environment in the cavity 512. One or more MEMS devices 206 are disposed in the cavity 512. The region of the capping substrate 702 providing a boundary for the cavity 512 may be coated with a material 514 having anti-stiction properties, substantially similar to as described above with reference to the capping substrate 502 of FIG. 5.

The method 100 then proceeds to block 114 where the capping substrate (e.g., wafer) is singulated (also referred to as diced). The capping substrate may be singulated by grinding, sawing, and/or other separation techniques. Referring to the example of FIG. 6, a grinder apparatus 602 grinds the capping substrate 502 until the thin region 504 is removed. Thus, the capping substrate 502 is singulated. Referring to the example of FIG. 8, a saw apparatus 802 saws the capping substrate 702 until the capping substrate 702 is singulated. The substrate 202 may be singulated in a subsequent process.

Figure 6:
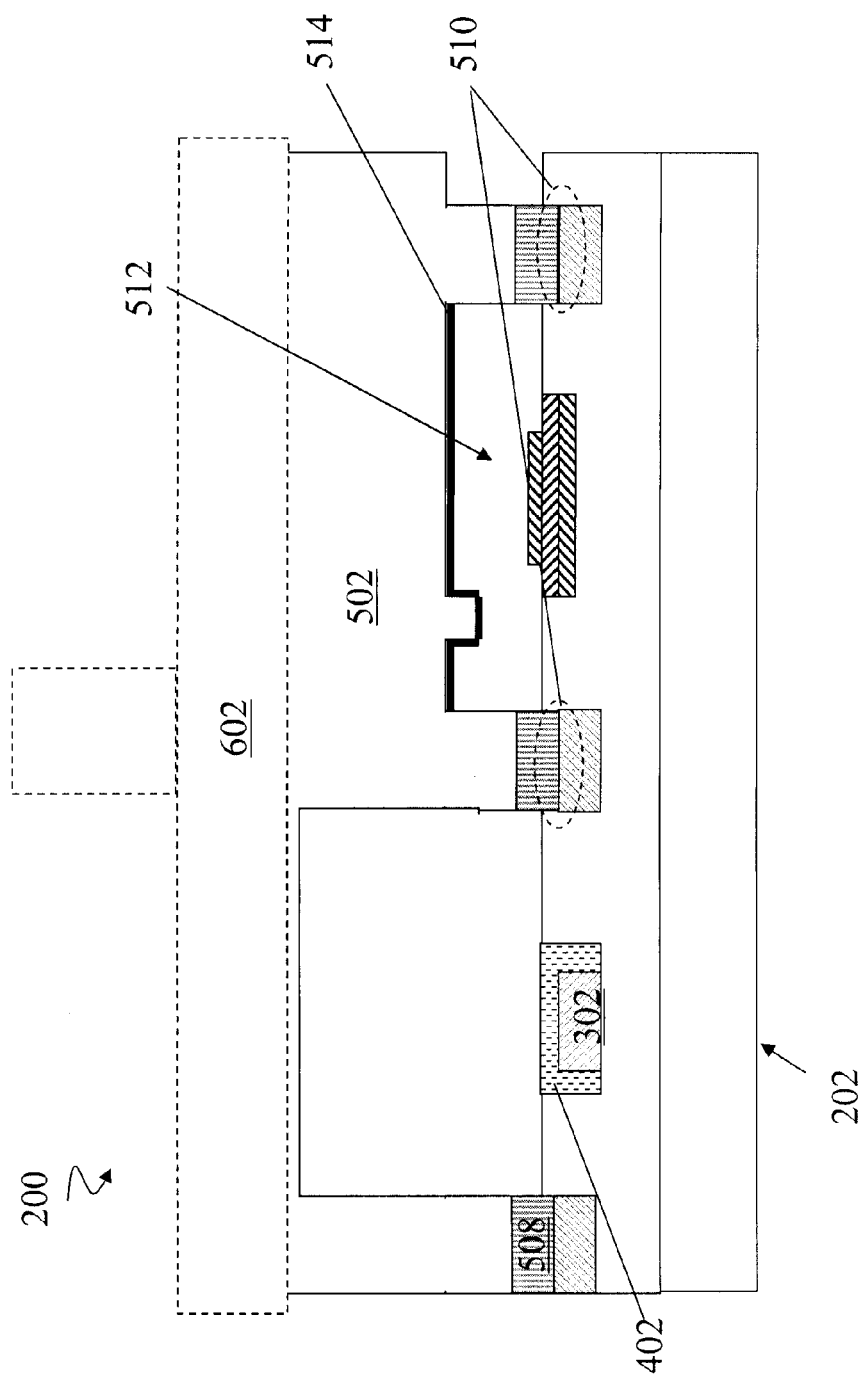
Figure 8:
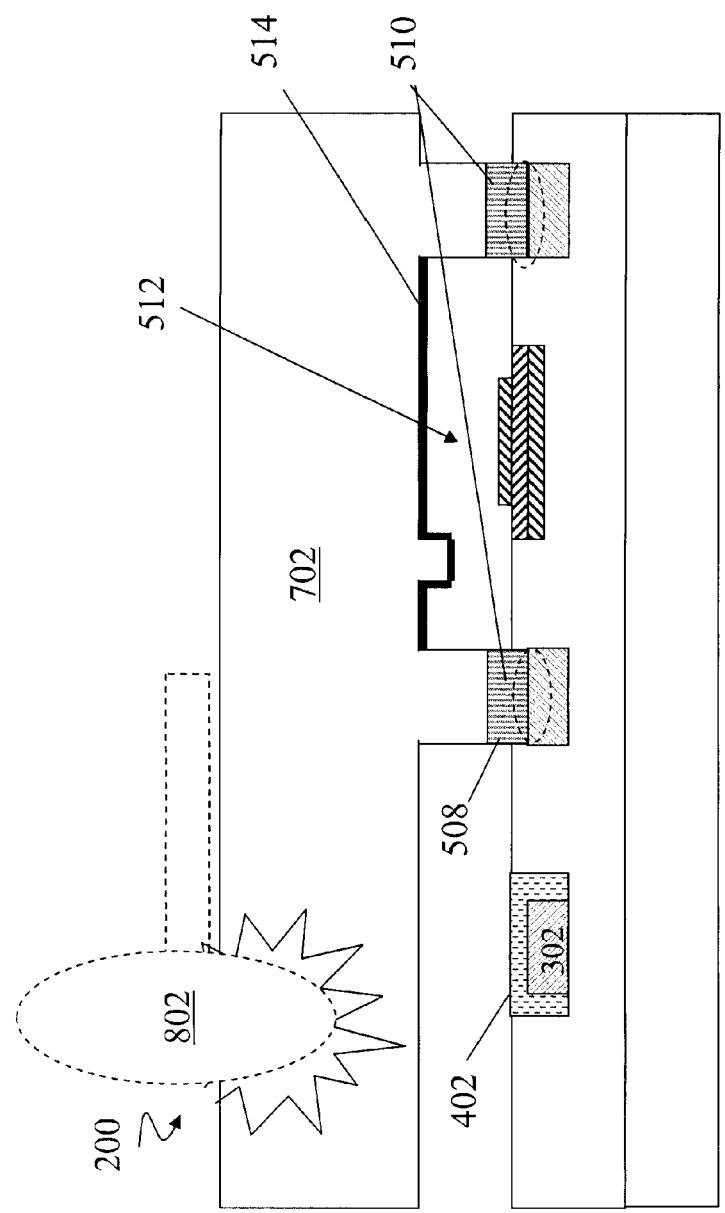

It is noted that FIGS. 6 and 8 illustrate that during the singulation of the capping substrate 502 and/or 702, respectively, the bond pad 302 is disposed under the protective layer 402. Thus, as the capping substrate 502 and/or 702 is diced, fragments or particles of the capping substrate 502/702 that are incident the substrate 202 do not come into contact with the bond pad 302. In contrast, an exposed pad may come into contact with particles or fragments, for example, silicon fragments, from the capping substrate. These fragments may cause scratches, corrosion, contamination, and/or other damage or defects to the pad. This damage or defects to the pad may decrease the ability to subsequently provide a connection (bond) to the pad.

Figure 9:
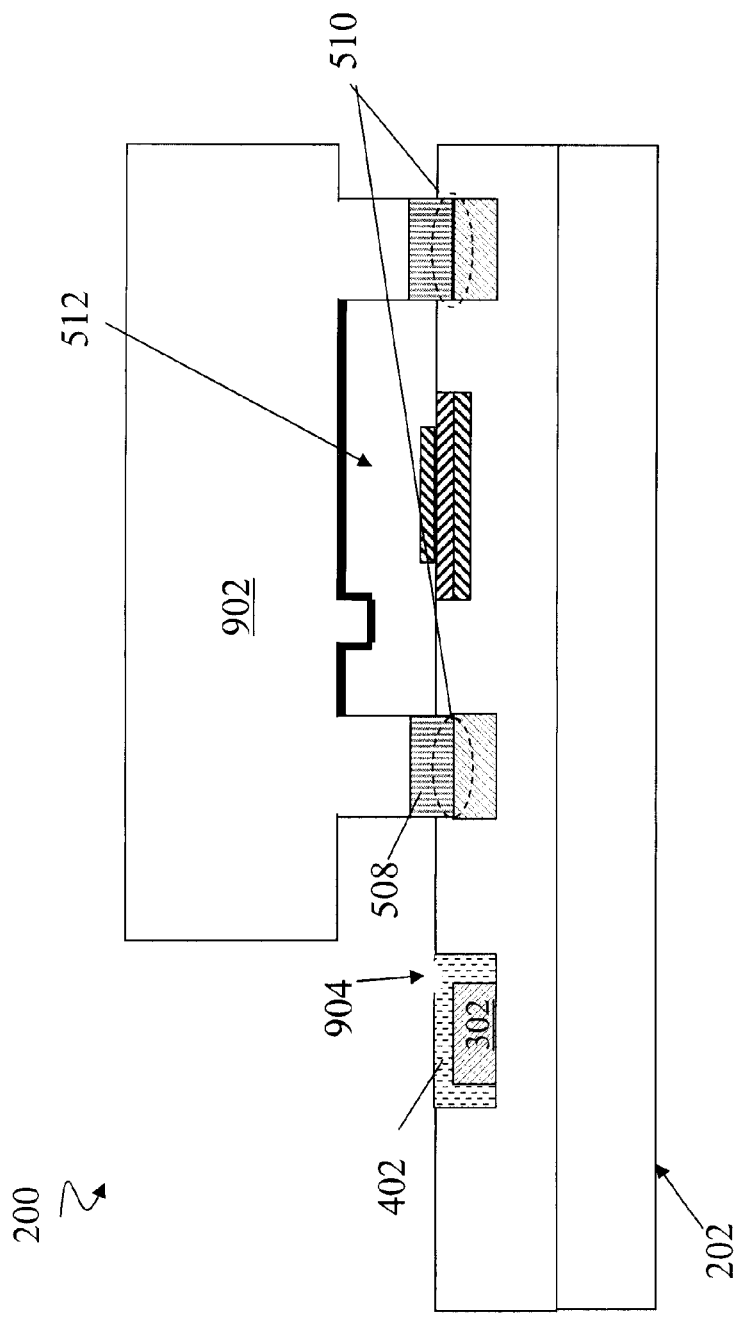

FIG. 9 illustrates the device 200 having the capping substrate singulated to form a resultant capping substrate 902. The device of FIG. 9 may result from the singulation illustrated in FIG. 6 or FIG. 8. The protective layer 402 includes damage 904 from fragments and/or particles from the singulation process of the capping substrate. It is noted that this damage is included in the protective layer 402 and does not extend to the bond pad 302, underlying the protective layer 402. Thus, FIG. 9 is illustrative of an advantage of certain embodiments of the present disclosure. For example, damage to a pad can be minimized and/or avoided by positioning the pad in a recess and/or forming a protective layer thereon.

Figure 10:
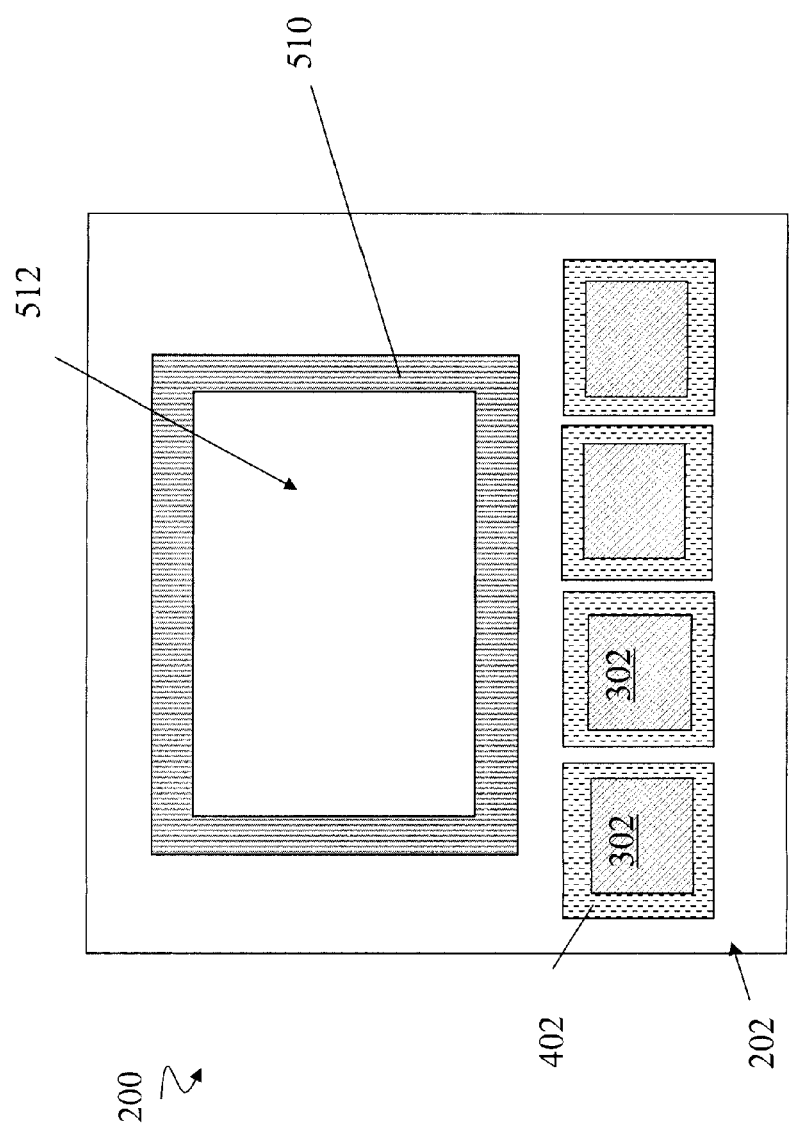
FIG. 10 illustrates a corresponding top view.

FIG. 10 illustrates a top view of the device 200 after singulation of the capping substrate. FIG. 10 may correspond to the device 200 as illustrated in FIG. 9. FIG. 10 includes the cavity 512 and the bond region 510. A plurality of bond pads 302 is provided having protective material 402. (It is noted that the protective material 402 is not illustrated on the top surface of the bond pad 302 for ease of explanation.)

The method 100 then proceeds to block 116 where the protective layer is removed after the completion of the singulation process. The protective layer may be removed by a plasma process (e.g., O2 plasma etch), a wet etch process such as hydrofluoric (HF), and/or other suitable etching techniques. In an embodiment, the protective layer may remain on the device substrate adjacent the connective elements providing the physical connection between substrates. For example, the protective layer formed within the cavity may not be removed.

Figure 11:
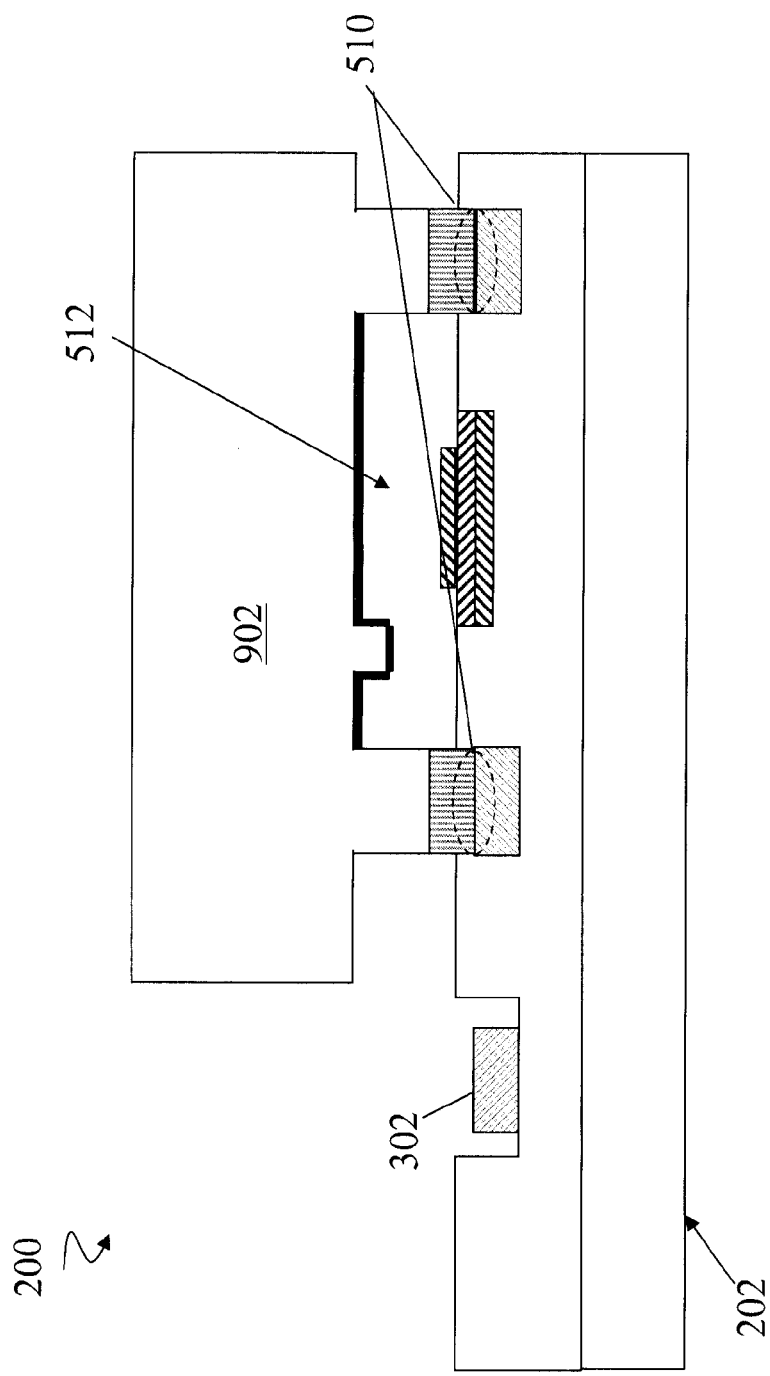

Referring to FIG. 11, illustrated is the device 200 having the protective layer 402 removed from the substrate 202 and in particular from the recess 304 including the bond pad 302.

Figure 12:
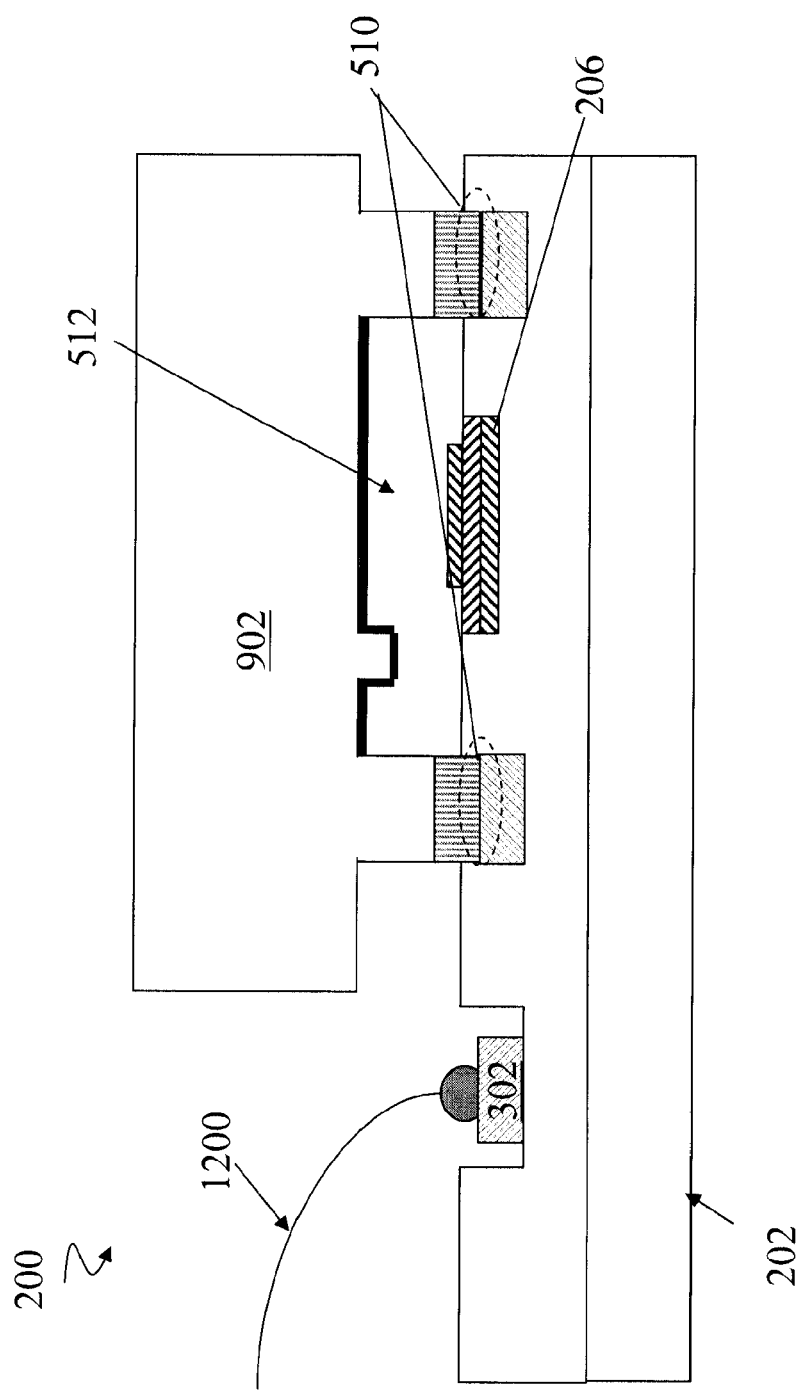

The method 100 then proceeds to block 118 where a connection is provided to the bond pad after the protective layer has been removed. The connection may provide an electrical and physical connection to the substrate 202 via the bond pad 302. The connection may be provided by a wire bond, conductive bump, and/or other suitable bonding process. Referring to FIG. 12, a wire bond 1200 is provided to the bond pad 302. The wire bond 1200 provides an I/O connection (e.g., outside of the substrate 202 and/or device 200) connection to one or more devices formed on the substrate 202.

Thus, provided is a device that includes a connective element, such as a bond pad, that is recessed below a top surface of a device substrate (having a MEMS device formed thereon). In an embodiment, the connective element (bond pad) is covered by a protective layer during the singulation or dicing of an overlying substrate. A bond pad that is recessed and/or protected may be a pad that is subsequently wire bonded to, for example, providing an electrical I/O connection to one or more devices on the substrate. Additional connective elements may also be recessed including those providing bonding regions between substrates. The connective element may be recessed such that its bottom and/or top surface lies below the plane of the surface of the device substrate.

In doing so, certain embodiments of the present disclosure offer several advantages over prior art devices. Advantages of the present disclosure include minimizing the damage to a connective element, such as a bond pad, during the assembly process including dicing of a substrate. It is understood that different embodiments disclosed herein offer different disclosure, and that they may make various changes, substitutions and alterations herein without departing from the spirit and scope of the present disclosure.

Thus, in an embodiment the present disclosure describes a method including providing a first substrate and forming a microelectromechanical system (MEMS) device on a first surface of the first substrate. A bond pad is then formed on at least one bonding site on the first surface of the first substrate, wherein the bonding site is recessed from the first surface. In an embodiment, the bonding site includes a recess formed on the substrate and the bond pad formed in the recess. Thus, in an embodiment, a bond is formed that is recessed below the surface of the substrate (e.g., a top surface of the bond pad lies below a top surface of the substrate).

What is claimed is:

1. A method, comprising:
   etching a first substrate to form a first recess and a second recess;
   forming a first connective element in the first recess;
   forming a protective layer on the first substrate to cover the first recess and the second recess;
   removing at least a portion of the protective layer from the first substrate; and
   bonding a second substrate to the first substrate by a second connective element.

2. The method of claim 1, wherein the second substrate is a capping substrate providing a cavity for a microelectromechanical system (MEMS) device on the first substrate.

3. The method of claim 1, further comprises:
   forming a second connective element in the second recess.

4. The method of claim 1, wherein the protective layer is formed over the first and the second recesses and the at least a portion of the protective layer is removed from the second recess of the first substrate.

5. The method of claim 1, further comprising:
   providing an electrical connection between at least one device and the first connective element on the first substrate.

6. The method of claim 5, wherein the electrical connection includes a wire bond physically connected to the first connective element.

7. The method of claim 1, wherein the protective layer includes at least one of an oxide, a nitride, amorphous carbon, diamond-like carbon, and amorphous silicon.

8. A method, comprising:
   forming a microelectromechanical system (MEMS) device on a first substrate;
   forming a protective layer on at least one bonding site on the first substrate, wherein the bonding site is recessed from a surface of the first substrate;
   bonding a second substrate to the first substrate; and
   singulating the second substrate while at least a portion of the protective layer is disposed on the bonding site.

9. The method of claim 8, wherein the at least one bonding site includes a bond pad that is electrically connected to at least one feature of an integrated circuit (IC) device disposed on the first substrate.

10. The method of claim 8, wherein forming the protective layer on the at least one bonding site further includes forming the protective layer over a bond pad on the at least one bonding site.

11. The method of claim 8, wherein the bonding provides a cavity surrounding the MEMS device.

12. The method of claim 8, further comprising:
    removing the protective layer after singulating the second substrate.

13. The method of claim 8, wherein the second substrate comprises a portion having a first thickness and a second portion having a second thickness that is different than the first thickness, wherein singulating the second substrate includes grinding the portion of the second substrate having the second thickness.

14. The method of claim 8, wherein the singulating further comprises:

dicing a portion of the second substrate disposed above the at least one bonding site.

15. The method of claim 8, wherein the bonding site comprises a first bonding site and a second bonding site, the bonding further comprising:

bonding a first stand-off element of the second substrate to a bonding element disposed on the first bonding site; and bonding a second stand-off element of the second substrate to a bonding element disposed on the second bonding site, wherein the first and second stand-off elements are configured to provide a separation between the first substrate and the second substrate.

16. The method of claim 8, wherein singulating the second substrate includes removing a portion of the second substrate to expose a portion of the protective layer.

17. The method claim 8, further comprising removing the protective layer on the at least one bonding site on the first substrate to expose a bonding pad.

18. The method claim 17, wherein removing the protective layer on the at least one bonding site on the first substrate to expose the bonding pad occurs after bonding the second substrate to the first substrate.

19. The method of claim 8, further comprising forming an anti-stiction material layer on the second substrate.

20. The method of claim 8, wherein the protective layer includes at least one of an oxide, a nitride, amorphous carbon, diamond-like carbon, and amorphous silicon.

* * * * *